(12) United States Patent
Inoue et al.

(10) Patent No.: US 11,139,138 B2
(45) Date of Patent: Oct. 5, 2021

(54) MULTIPLE ELECTRON BEAMS IRRADIATION APPARATUS

(71) Applicants: NuFlare Technology, Inc., Yokohama (JP); NuFlare Technology America, Inc., Sunnyvale, CA (US)

(72) Inventors: Kazuhiko Inoue, Yokohama (JP); Atsushi Ando, Edogawa-ku (JP); Munehiro Ogasawara, Hiratsuka (JP); John Hartley, Stormville, NY (US)

(73) Assignees: NuFlare Technology, Inc., Yokohama (JP); NuFlare Technology America, Inc., Sunnyvale, CA (US)

( * ) Notice: Subject to any disclaimer, the term of this patent is extended or adjusted under 35 U.S.C. 154(b) by 0 days.

(21) Appl. No.: 16/809,611

(22) Filed: Mar. 5, 2020

(65) Prior Publication Data
US 2020/0286704 A1    Sep. 10, 2020

Related U.S. Application Data

(60) Provisional application No. 62/814,087, filed on Mar. 5, 2019.

(51) Int. Cl.
*H01J 37/06* (2006.01)
*H01J 37/20* (2006.01)
(Continued)

(52) U.S. Cl.
CPC ............ *H01J 37/063* (2013.01); *H01J 37/10* (2013.01); *H01J 37/20* (2013.01); *H01J 37/244* (2013.01); *H01J 2237/2448* (2013.01)

(58) Field of Classification Search
CPC ........ H01J 37/063; H01J 37/20; H01J 37/244; H01J 37/10; H01J 37/28; H01J 2237/2448;
(Continued)

(56) References Cited

U.S. PATENT DOCUMENTS 10,886,102 B2 *  1/2021  Inoue ................. H01J 37/3045
2006/0289804 A1  12/2006  Knippelmeyer et al.
(Continued)

FOREIGN PATENT DOCUMENTS

JP    2017-513460      5/2007
JP    2014-229481 A   12/2014
(Continued)

OTHER PUBLICATIONS

Combined Taiwanese Office Action and Search Report dated Dec. 8, 2020 in Taiwanese Patent Application No. 109100562 (with English translation), 8 pages.

*Primary Examiner* — Nicole M Ippolito
(74) *Attorney, Agent, or Firm* — Oblon, McClelland, Maier & Neustadt, L.L.P.

(57) ABSTRACT

A multiple electron beam irradiation apparatus includes a forming mechanism which forms multiple primary electron beams; a plurality of electrode substrates being stacked in each of which a plurality of openings of various diameter dimensions are formed, the plurality of openings being arranged at passage positions of the multiple primary electron beams, and through each of which a corresponding one of the multiple primary electron beams passes, the plurality of electrode substrates being able to adjust an image plane conjugate position of each of the multiple primary electron beams depending on a corresponding one of the various diameter dimensions; and a stage which is capable of mounting thereon a target object to be irradiated with the multiple primary electron beams having passed through the plurality of electrode substrates.

10 Claims, 11 Drawing Sheets

(51) Int. Cl.
*H01J 37/24* (2006.01)
*H01J 37/10* (2006.01)
*H01J 37/063* (2006.01)
*H01J 37/244* (2006.01)

(58) Field of Classification Search
CPC ....... H01J 2237/145; H01J 2237/04926; H01J 37/145; H01J 2237/1205; H01J 2237/1207; H01J 2237/121
USPC ............. 250/306, 307, 309, 310, 311, 492.1, 250/492.2, 492.21, 492.22, 492.23, 492.3
See application file for complete search history.

(56) References Cited

U.S. PATENT DOCUMENTS

| | | |
|---|---|---|
| 2018/0024082 A1 | 1/2018 | Ando |
| 2018/0130632 A1 | 5/2018 | Ogasawara et al. |
| 2019/0355547 A1 | 11/2019 | Ando et al. |
| 2020/0211812 A1* | 7/2020 | Inoue ..................... H01J 37/28 |

FOREIGN PATENT DOCUMENTS

| | | |
|---|---|---|
| JP | 2019-186140 A | 10/2019 |
| JP | 2019-200983 A | 11/2019 |
| TW | 201812289 A | 4/2018 |
| TW | 201830150 A | 8/2018 |
| WO | 2005/024881 A2 | 3/2005 |

\* cited by examiner

MULTIPLE ELECTRON BEAMS IRRADIATION APPARATUS

CROSS-REFERENCE TO RELATED APPLICATION

This application is based upon and claims the benefit of priority from prior Provisional Patent Application No. 62/814,087 filed on Mar. 5, 2019 in U.S.A., the entire contents of which are incorporated herein by reference.

BACKGROUND OF THE INVENTION

Field of the Invention

Embodiments of the present invention relate to a multiple electron beam irradiation apparatus. For example, embodiments of the present invention relate to an inspection apparatus for inspecting a pattern by acquiring a secondary electron image of the pattern emitted by irradiation with multiple electron beams.

Description of Related Art

In recent years, with the advance of high integration and large capacity of LSI (Large Scale Integrated circuits), the line width (critical dimension) required for circuits of semiconductor elements is becoming progressively narrower. Since LSI manufacturing requires a tremendous amount of manufacturing cost, it is crucially essential to improve its yield. However, as typified by a 1-gigabit DRAM (Dynamic Random Access Memory), the scale of patterns configuring an LSI is in transition from on the order of sub-microns to on the order of nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on the mask used for exposing/transferring an ultrafine pattern onto a semiconductor wafer by the photolithography technology. Therefore, the pattern inspection apparatus for inspecting defects on a transfer mask used in manufacturing LSI needs to be highly accurate.

As an inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there are "die-to-die inspection" and "die-to-database inspection". The "die-to-die inspection" method compares data of measured images acquired by imaging the same patterns at different positions on the same substrate. The "die-to-database inspection" method generates, based on pattern design data, design image data (reference image) to be compared with a measured image being measured data acquired by imaging a pattern. Then, acquired images are transmitted as measured data to the comparison circuit. After performing alignment between images, the comparison circuit compares the measured data with reference data according to an appropriate algorithm, and determines that there is a pattern defect if the compared data do not match with each other.

Specifically with respect to the pattern inspection apparatus described above, in addition to the type of apparatus that irradiates an inspection substrate with laser beams in order to obtain a transmission image or a reflection image of a pattern formed on the substrate, there has been developed another inspection apparatus that acquires a pattern image by scanning the inspection substrate with primary electron beams and detecting secondary electrons emitted from the inspection substrate by the irradiation with the primary electron beams. Regarding the inspection apparatus utilizing electron beams, an apparatus using multiple beams has also been under development. In a multiple beam irradiation apparatus, as the beam irradiating the surface of the target object comes away from the optical axis center to be toward the periphery, a difference arises in the beam spot diameter due to the effect of field curvature aberration. Therefore, if the field of view (FOV) is expanded, blurring of the beam increases under the influence of the aberration. Thus, there occurs a problem that it is difficult to expand the FOV in the apparatus for observing the surface of the target object, the inspection apparatus, etc. There is proposed to deflect a plurality of charged particle beams so as to correct chromatic aberration and spherical aberration by using an aberration corrector composed of a lens array, a quadrupole array, and a deflector array in which are disposed a plurality of deflectors having a function of a concave lens for deflecting the charged particle beams to be away from the optical axis (Japanese Patent Application Laid-open (JP-A) No. 2014-229481). However, if blurring is corrected for each beam, a power source is individually needed for each beam because an applied potential differs for each beam, thereby making the apparatus configuration extremely large.

BRIEF SUMMARY OF THE INVENTION

According to one aspect of the present invention, a multiple electron beam irradiation apparatus includes a forming mechanism which forms multiple primary electron beams;

a plurality of electrode substrates being stacked in each of which a plurality of openings of various diameter dimensions are formed, the plurality of openings being arranged at passage positions of the multiple primary electron beams, and through each of which a corresponding one of the multiple primary electron beams passes, the plurality of electrode substrates being able to adjust an image plane conjugate position of the each of the multiple primary electron beams depending on a corresponding one of the various diameter dimensions; and a stage which is capable of mounting thereon a target object to be irradiated with the multiple primary electron beams having passed through the plurality of electrode substrates.

According to another aspect of the present invention, a multiple electron beam irradiation method includes forming multiple primary electron beams;

making the multiple primary electron beams pass through a plurality of electrode substrates being stacked in each of which a plurality of openings of various diameter dimensions are formed, the plurality of openings being arranged at passage positions of the multiple primary electron beams, and through each of which a corresponding one of the multiple primary electron beams passes, the plurality of electrode substrates being able to adjust an image plane conjugate position of the each of the multiple primary electron beams depending on a corresponding one of the various diameter dimensions; and irradiating a target object placed on a stage with the multiple primary electron beams having passed through the plurality of electrode substrates.

DETAILED DESCRIPTION OF THE INVENTION

Embodiments below describe a multiple electron beam inspection apparatus as an example of a multiple electron beam irradiation apparatus. The multiple electron beam irradiation apparatus is not limited to the inspection apparatus, and may be an apparatus irradiating multiple electron beams so as to acquire an image, for example.

First Embodiment

Figure 1:
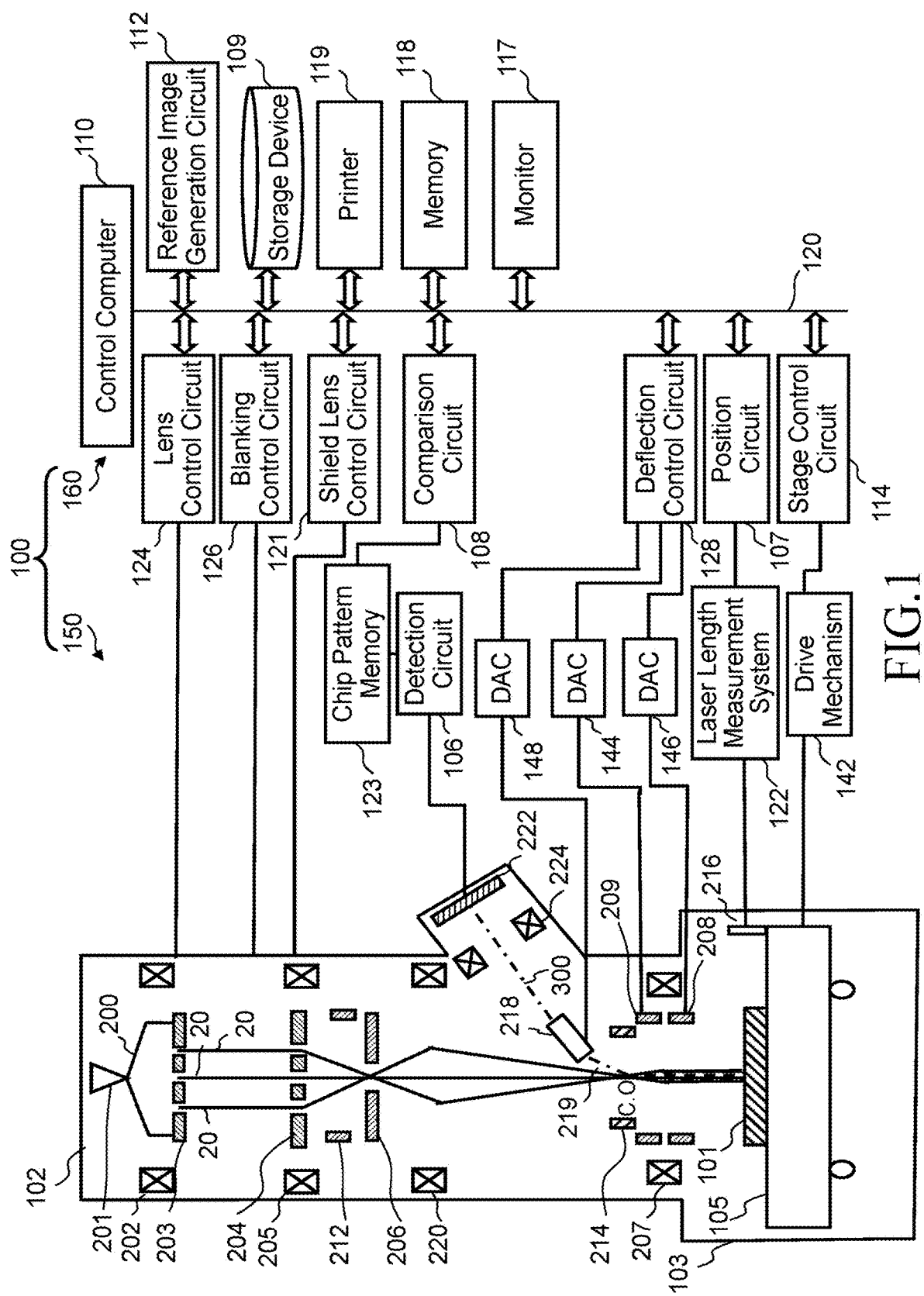
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on a substrate is an example of a multiple electron beam inspection apparatus. The inspection apparatus 100 includes an image acquisition mechanism 150 and a control system circuit 160. The image acquisition mechanism 150 includes an electron beam column 102 (also called an electron optical column) (an example of a multi-beam column), an inspection chamber 103, a detection circuit 106, a chip pattern memory 123, a stage drive mechanism 142, and a laser length measuring system 122. In the electron beam column 102, there are disposed an electron gun 201, an illumination lens 202, a shaping aperture array substrate 203 (an example of a forming mechanism), an electromagnetic lens 205, an aberration corrector 204, a common blanking deflector 212, a limiting aperture substrate 206, an electromagnetic lens 220, a beam separator 214, an objective lens 207, a main deflector 208, a sub deflector 209, a deflector 218, a projection lens 224, and a multi-detector 222. The primary electron beam optical system is composed of the illumination lens 202, the shaping aperture array substrate 203, the electromagnetic lens 205, the aberration corrector 204, the common blanking deflector 212, the limiting aperture substrate 206, the electromagnetic lens 220, the beam separator 214, the objective lens 207, the main deflector 208, and the sub deflector 209. The secondary electron beam optical system is composed of the beam separator 214, the deflector 218, and the projection lens 224.

An XY stage 105 movable at least in the x-y plane is disposed in the inspection chamber 103. A substrate 101 (target object) to be inspected is mounted on the XY stage 105. The substrate 101 may be an exposure mask substrate, or a semiconductor substrate such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is composed of a plurality of figure patterns. If the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the XY stage 105, for example. Moreover, on the XY stage 105, there is disposed a mirror 216 which reflects a laser beam for measuring a laser length emitted from the laser length measuring system 122 arranged outside the inspection chamber 103. The multi-detector 222 is connected, at the outside of the electron beam column 102, to the detection circuit 106. The detection circuit 106 is connected to the chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, an aberration correction circuit 121, a lens control circuit 124, a blanking control circuit 126, a deflection control circuit 128, a storage device 109 such as a magnetic disk drive, a monitor 117, a memory 118, and a printer 119. The deflection control circuit 128 is connected to DAC (digital-to-analog conversion) amplifiers 144, 146, and 148. The DAC amplifier 146 is connected to the main deflector 208. The DAC amplifier 144 is connected to the sub deflector 209. The DAC amplifier 148 is connected to the deflector 218. The aberration correction circuit 121 is connected to the aberration corrector 204.

The chip pattern memory 123 is connected to the comparison circuit 108. The XY stage 105 is driven by the stage drive mechanism 142 under the control of the stage control circuit 114. With respect to the stage drive mechanism 142, for example, the drive system, such as a three (x-, y-, and θ-) axis motor which provides drive in the directions of x, y, and θ in the stage coordinate system, can move the XY stage 105. A step motor, for example, can be used as each of these x, y, and θ motors (not shown). The XY stage 105 is movable in the horizontal direction and the rotation direction by the X-, Y-, and θ-axis motors. The movement position of the XY stage 105 is measured by the laser length measuring system 122, and supplied (transmitted) to the position circuit 107. Based on the principle of laser interferometry, the laser length measuring system 122 measures the position of the XY stage 105 by receiving a reflected light from the mirror 216. In the stage coordinate system, the x, y, and θ directions are set with respect to a plane orthogonal to the optical axis of the multiple primary electron beams, for example.

The common blanking deflector 212 is composed of at least two electrodes (or "at least two poles"), and controlled by the blanking control circuit 126. The main deflector 208 is composed of at least four electrodes (or "at least four poles"), and controlled by the deflection control circuit 128 through the DAC amplifier 146 disposed for each electrode. Similarly, the sub deflector 209 is composed of at least four electrodes (or "at least four poles"), and controlled by the deflection control circuit 128 through the DAC amplifier 144 disposed for each electrode. Similarly, the deflector 218 is composed of at least four electrodes (or "at least four poles"), and controlled by the deflection control circuit 128 through the DAC amplifier 148 disposed for each electrode.

FIG. 1 shows configuration elements necessary for describing the first embodiment. It should be understood that other configuration elements generally necessary for the inspection apparatus 100 may also be included therein.

Figure 2:
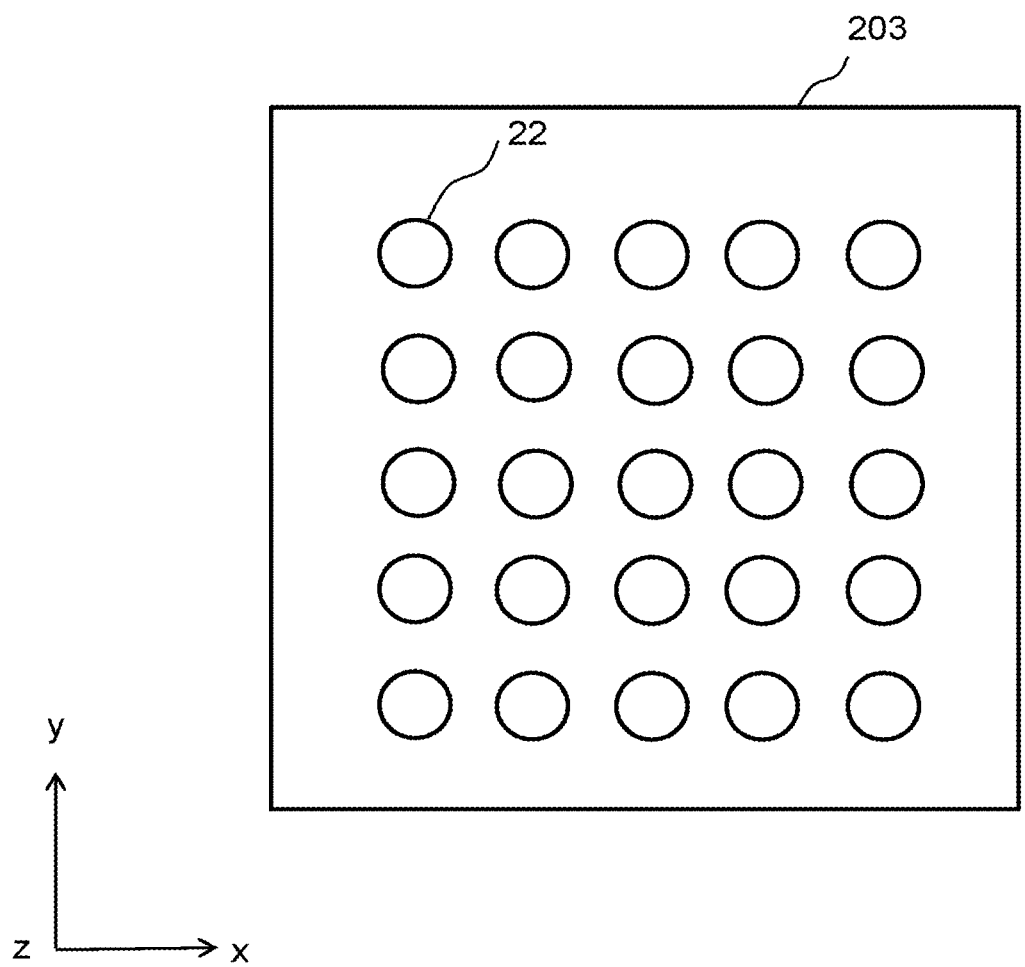
FIG. 2 is a conceptual diagram showing a structure of a shaping aperture array substrate according to the first embodiment.

FIG. 2 is a conceptual diagram showing a structure of a shaping aperture array substrate according to the first embodiment. As shown in FIG. 2, holes (openings) 22 of $m_1$ columns wide (width in the x direction) and $n_1$ rows long (length in the y direction) are two-dimensionally formed at a predetermined arrangement pitch in the shaping aperture array substrate 203, where $m_1$ and $n_1$ are integers of 2 or more. In the case of FIG. 2, holes (openings) 22 of 5×5, that is 5 (columns of holes arrayed in the x direction)×5 (rows of holes arrayed in the y direction), are formed. The arrangement number of the holes 22 is not limited thereto. Each of the holes 22 is a circle with the same outer diameter. Alternatively, each of the holes 22 may be a rectangle (including a square) having the same dimension, shape, and size. Multiple beams 20 are formed by letting portions of an electron beam 200 individually pass through a corresponding one of a plurality of holes 22. With respect to the arrangement of the holes 22, although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where the holes are arranged like a grid in the width and length directions. For example, with respect to the kth and the (k+1)th rows which are arrayed (accumulated) in the length direction (in the y direction) and each of which is in the x direction, each hole in the kth row and each hole in the (k+1)th row may be mutually displaced in the width direction (in the x direction) by a dimension "a". Similarly, with respect to the (k+1)th and the (k+2)th rows which are arrayed (accumulated) in the length direction (in the y direction) and each of which is in the x direction, each hole in the (k+1)th row and each hole in the (k+2)th row may be mutually displaced in the width direction (in the x direction) by a dimension "b".

Now, operations of the image acquisition mechanism 150 in the inspection apparatus 100 are described below.

The electron beam 200 emitted from the electron gun 201 (emission source) almost perpendicularly (e.g., vertically) illuminates the whole of the shaping aperture array substrate 203 by the illumination lens 202. As shown in FIG. 2, a plurality of holes 22 (openings) are formed in the shaping aperture array substrate 203. The region including all the plurality of holes 22 is irradiated by the electron beam 200. For example, a plurality of electron beams (multiple primary electron beams) 20 (solid lines in FIG. 1) are formed by letting portions of the electron beam 200, which irradiate the positions of a plurality of holes 22, individually pass through a corresponding one of the plurality of holes 22 in the shaping aperture array substrate 203.

Each of the formed multiple primary electron beams 20 spreads after having individually converged at a position (not shown) conjugate to an image plane, and enters the electromagnetic lens 205. Then, the formed multiple primary electron beams 20 in the state where each beam is spreading are refracted toward the hole in the center of the limiting aperture substrate 206 by the electromagnetic lens 205. In other words, when receiving the incident multiple primary electron beams 20, the electromagnetic lens 205 refracts them. At this stage, if all of the multiple primary electron beams 20 are collectively deflected by the common blanking deflector 212, they deviate from the hole in the center of the limiting aperture substrate 206 and are blocked by the limiting aperture substrate 206. On the other hand, the multiple primary electron beams 20 which were not deflected by the common blanking deflector 212 pass through the hole in the center of the limiting aperture substrate 206 as shown in FIG. 1. Blanking control of all the multiple primary electron beams 20 is collectively provided by ON/OFF of the common blanking deflector 212 to control ON/OFF of the multiple primary electron beams collectively. Thus, the limiting aperture substrate 206 blocks the multiple primary electron beams 20 which were deflected to be in the OFF condition by the common blanking deflector 212. Then, the multiple primary electron beams 20 for inspection are formed by the beams having been made during a period from becoming "beam ON" to becoming "beam OFF" and having passed through the limiting aperture substrate 206.

The multiple primary electron beams 20 having passed through the limiting aperture substrate 206 travel toward the electromagnetic lens 220. Receiving the incident multiple primary electron beams 20, the electromagnetic lens 220 refracts them. The multiple primary electron beams 20 form a crossover (C.O.) for each beam by the electromagnetic lens 220. After passing through the beam separator 214 disposed at the position of the crossover formed for each beam, the multiple primary electron beams 20 are focused on the substrate 101 (target object) by the objective lens 207 to be a pattern image (beam diameter) of a desired reduction ratio. Then, all the multiple primary electron beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple primary electron beams 20 to the reference position of the mask die to be scanned by the multiple primary electron beams 20. According to the first embodiment, scanning is performed while continuously moving the XY stage 105, for example. Therefore, the main deflector 208 performs tracking deflection to follow the movement of the XY stage 105. Then, the sub deflector 209 collectively deflects all of the multiple primary electron beams 20 so that each beam may scan a corresponding region. Ideally, the multiple primary electron beams 20 irradiating at a time are aligned at the pitch obtained by multiplying the arrangement pitch of a plurality of holes 22 in the shaping aperture array substrate 203 by a desired reduction ratio (1/a). Thus, the electron beam column 102 irradiates the substrate 101 with two-dimensional $m_1 \times n_1$ multiple beams 20 at a time.

A flux of secondary electrons (multiple secondary electron beams 300) (dotted lines in FIG. 1) including reflected electrons, each corresponding to each of the multiple primary electron beams 20, is emitted from the substrate 101 because desired positions on the substrate 101 are irradiated with the multiple primary electron beams 20. In FIG. 1, a single beam is shown on behalf of the multiple secondary electron beams 300.

The multiple secondary electron beams 300 emitted from the substrate 101 are refracted toward their center by the objective lens 207, and travel toward the beam separator 214 disposed at the crossover position. The beam separator 214 separates the multiple secondary electron beams 300, which are emitted from the substrate 101 (target object) because its surface is irradiated with the multiple primary electron beams 20, from the multiple primary electron beams 20.

The beam separator 214 generates an electric field and a magnetic field to be orthogonal to each other in a plane perpendicular to the traveling direction (optical axis) of the center beam of the multiple primary electron beams 20. The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20. In FIG. 1, a single beam is shown on behalf of the multiple secondary electron beams 300.

The multiple secondary electron beams 300 bent obliquely upward are further bent by the deflector 218 to travel to the projection lens 224. Then, the multiple secondary electron beams 300 deflected by the deflector 218 are projected onto the multi-detector 222 while being refracted by the projection lens 224. The multi-detector 222 individually detects the multiple secondary electron beams separated from the multiple primary electron beams 20. Specifically, the multi-detector 222 detects the projected multiple secondary electron beams 300. Tracking deflection is provided as described above since scanning is performed while continuously moving the XY stage 105. The deflector 218 cancels out (compensates for) deviation of the light receiving position of the multiple secondary electron beams 300 on the light receiving surface of the multi-detector 222, which is due to movement of the deflection positions of the multiple primary electron beams 20 along with the tracking deflection and the scanning operation, and deflects the multiple secondary electron beams 300 so that they may irradiate respective desired positions on the light receiving surface of the multi-detector 222. Then, the multi-detector 222 detects the multiple secondary electron beams 300. An image is formed on the substrate 101 by an intensity signal detected by the multi-detector 222.

Figure 3:
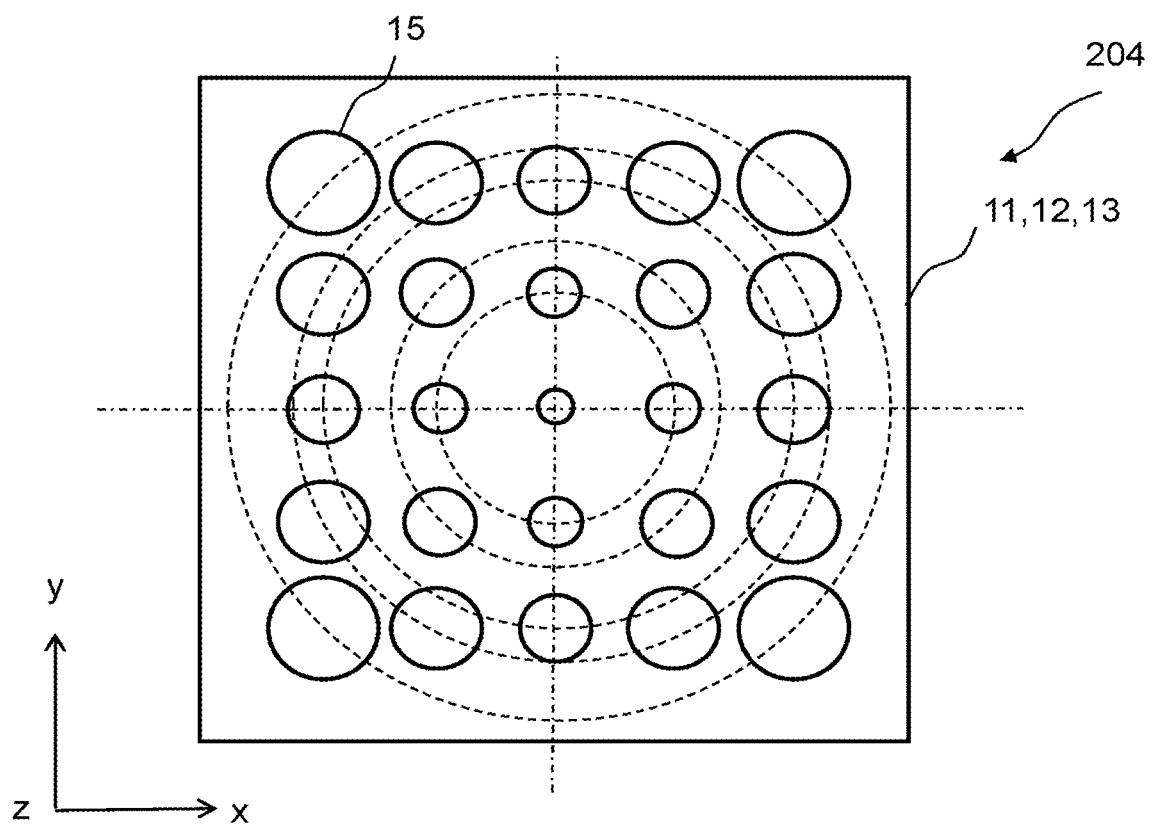
FIG. 3 is a top view illustrating a structure of an aberration corrector according to the first embodiment.
Figure 4:
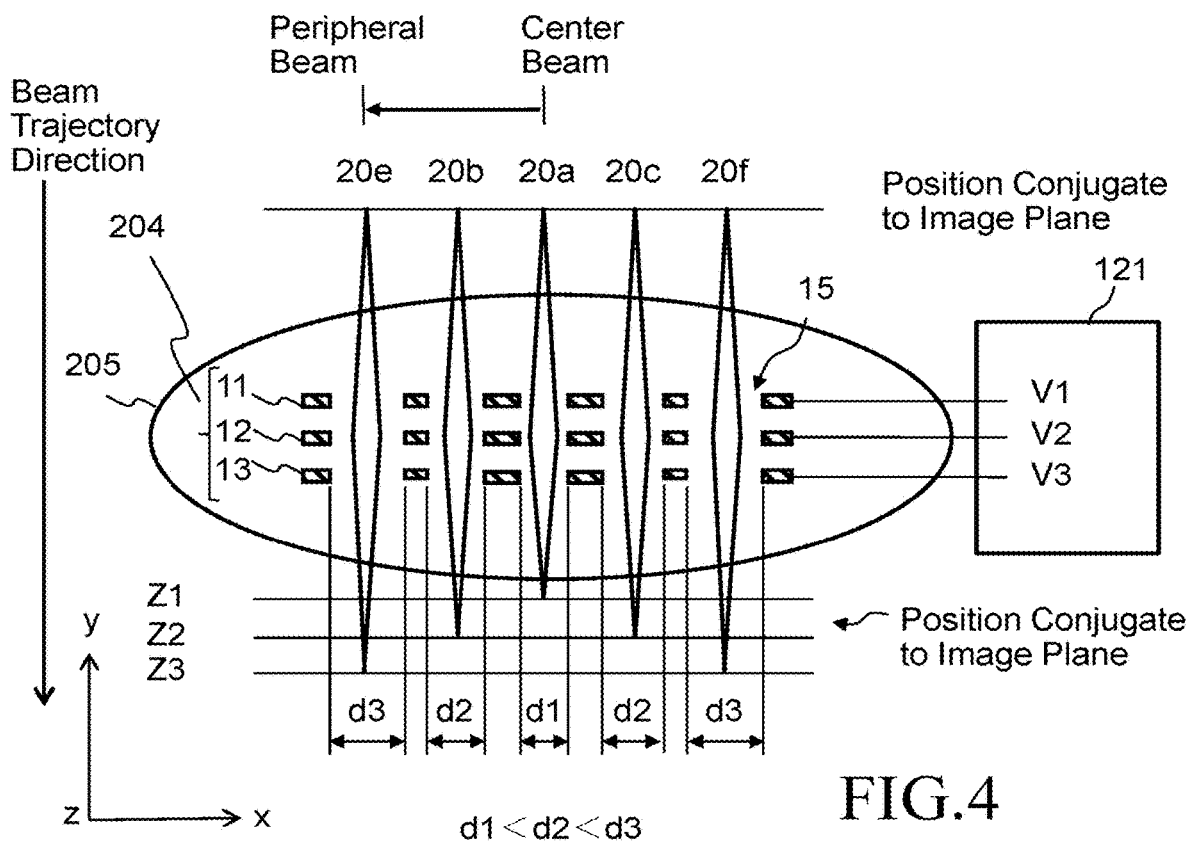
FIG. 4 is a sectional view illustrating a structure of an aberration corrector according to the first embodiment.

FIG. 3 is a top view showing a structure of the aberration corrector 204 according to the first embodiment. FIG. 4 is a section view illustrating a structure of the aberration corrector 204 according to the first embodiment. In FIG. 4, the aberration corrector 204 is disposed in the magnetic field of the electromagnetic lens 205. The aberration corrector 204 includes a plurality of electrode substrates 11, 12, and 13 which are stacked. The electrode substrates 11, 12, and 13 are arranged such that a predetermined space exists between adjacent electrode substrates. Each of the electrode substrates 11, 12, and 13 is formed of conductive material, such as a metal. Alternatively, it may be formed by coating a conductive thin film around an insulating material. As shown in FIGS. 3 and 4, in each of the electrode substrates 11, 12, and 13, a plurality of passage holes 15 are formed. The plurality of passage holes 15 are arranged at the passage positions of the multiple primary electron beams 20. Each of the plurality of passage holes 15 is formed to be corresponding to one different from the others of the passage positions of the multiple primary electron beams 20, and thus each beam of the multiple primary electron beams 20 passes through each passage hole. By independently applying an electric potential to each of the upper, the middle, and the lower electrode substrates 11, 12, and 13 from the aberration correction circuit 121, multiple electrostatic lenses which individually give a converging (or focusing) action on each beam is configured.

Here, according to the first embodiment, correction is performed by individually shifting (displacing) the image plane conjugate position (focus position) of each beam. Therefore, the converging action to be applied to each beam is corrected. Thus, each of a plurality of electrode substrates 11, 12, and 13 is disposed at a position different from the image plane conjugate position (the position conjugate to an image plane) of each beam of the multiple primary electron beams 20. In the case of FIG. 4, after converging at the image plane conjugate position, each beam of the multiple primary electron beams 20 formed by the shaping aperture array substrate 203 travels, while spreading, to the corresponding passage hole 15 in a plurality of the electrode substrates 11, 12, and 13. Then, in the process of passing through the passage hole 15, changing the state to perform convergence, each beam of the multiple primary electron beams 20 converges at a convergence point (image plane conjugate position) after passing through a plurality of the electrode substrates 11, 12, and 13. In that case, according to the first embodiment, the aberration corrector 204 shifts (displaces), for each beam, the image plane conjugate position of each beam after passing through a plurality of the electrode substrates 11, 12, and 13. In the case of FIG. 4, correction is performed such that the image plane conjugate position of each beam after passing through the aberration corrector 204 is shifted (displaced) to any one of three image plane conjugate positions Z1, Z2, and Z3 having different height positions. According to the first embodiment, converging actions of various kinds can be obtained by changing the diameter dimension of the passage hole 15.

Then, a plurality of passage holes 15 (openings) in each of the electrode substrates 11, 12, and 13 of the first embodiment are formed to have a plurality of diameter dimensions. The passage holes 15 in the stacked electrode substrates 11, 12, and 13 through which the same beam passes are formed to have the same diameter size. In the case of FIG. 3, there are circular passage holes of five different diameters with respect to 5×5 multiple primary electron beams 20. FIG. 4 shows the case where the passage hole 15 through which the center beam passes is formed to have a diameter d1, the passage holes 15 through which beams outside next to the center beam pass are formed to have a diameter d2, and the passage holes 15 through which beams outside next but one to the center beam pass are formed to have a diameter d3.

In FIG. 4, when adjusting the focus position of the center beam of the multiple primary electron beams 20 onto the surface of the substrate 101, (namely, when setting the center beam as a reference), the more the beam concerned is away from the center beam of the multiple primary electron beams 20, the more the beam focus position is upward away from the surface of the substrate 101 due to the field curvature aberration. When adjusting the focus position of a peripheral side beam (or a peripheral beam) which is a beam located on the inner side of the periphery of the multiple primary electron beams concerned, that is, when focusing the peripheral side beam of the multiple primary electron beams 20 onto the surface of the substrate 101, that is, when setting the peripheral side beam as a reference, where the term "peripheral" is for representing a contrast to the "center", the focus position of the center beam of the multiple primary electron beams 20 becomes downward away from the surface of the substrate 101 due to the field curvature aberration.

Therefore, it is necessary to correct the trajectory such that the more the beam concerned is away from the center beam of the multiple primary electron beams 20 toward the outer side, the more the image plane conjugate position after passage through the aberration corrector 204 is away from the aberration corrector 204. Then, according to the first embodiment, the lens actions of a plurality of electrostatic lenses are selectively applied using the passage holes 15 of different diameter sizes.

Figure 5:
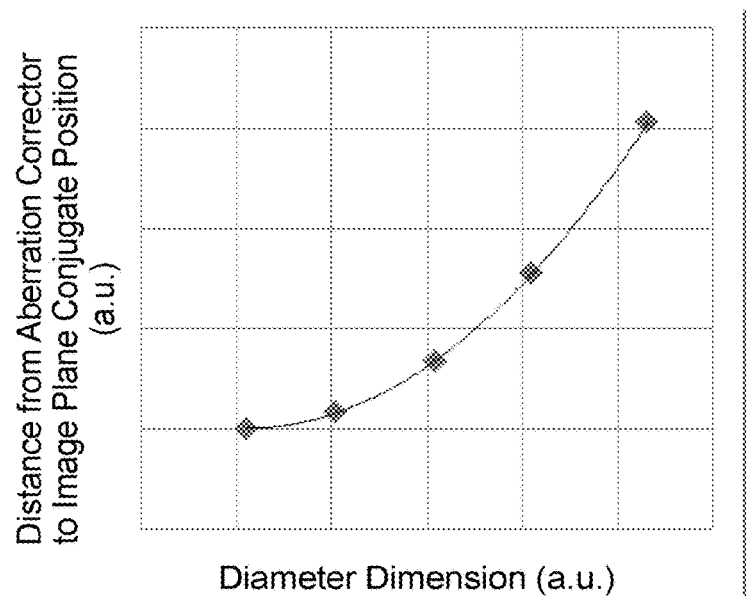
FIG. 5 shows an example of relation between an image plane conjugate position after passage through an aberration corrector and a diameter dimension of a passage hole according to the first embodiment.

FIG. 5 shows an example of relation between an image plane conjugate position after passage through an aberration corrector and a diameter dimension of a passage hole according to the first embodiment. In FIG. 5, the ordinate axis represents a distance (a.u.) from the aberration corrector 204 to an image plane conjugate position after passage through the aberration corrector 204. The abscissa axis represents a diameter dimension (a.u.) of the circular passage hole 15 formed in each of the electrode substrates 11, 12, and 13. In FIG. 5, for example, each of the electric potential V1 of the upper electrode substrate 11 and the electric potential V3 of the lower electrode substrate 13 is used as a ground potential GND, and a negative electric potential (negative control potential) of about −100 V is used as the electric potential V2 of the middle electrode substrate 12, for example. As shown in FIG. 5, the larger the diameter dimension of the passage hole 15 is, the larger the distance from the aberration corrector 204 to an image plane conjugate position after passage through the aberration corrector 204 is, that is, the farther the image plane conjugate position after passage through the aberration corrector 204 is away from the aberration corrector 204.

In the first embodiment, the image plane conjugate position of each beam of the multiple primary electron beams 20 is individually adjusted according to the diameter dimension of the passage hole 15 by using the stacked electrode substrates 11, 12, and 13. The closer to the center the beam is, the more the converging (focusing) action of the beam after passing through the aberration corrector 204 is made to increase by decreasing the diameter dimension of the passage hole 15. In other words, the closer to the center the beam is, the closer to the aberration corrector 204 the image plane conjugate position after passage through the aberration corrector 204 is located. Specifically, the passage hole 15 through which the center beam passes is formed to have the smallest diameter in a plurality of diameter dimensions, and the outer the passage hole 15 through which a peripheral side beam passes is located, the larger its diameter dimension is formed. In the case of FIG. 4, the passage hole 15 through which the center beam passes is formed to have the smallest diameter dimension d1, the passage holes 15 through which beams outside next to the center beam pass are formed to have a middle sized diameter dimension d2, and the passage holes 15 through which beams outside next but one to the center beam pass are formed to have a large diameter dimension d3. By applying, for example, a negative potential V2 (e.g., −100V) to the middle electrode substrate 12 based on the potential V1 (e.g., GND potential) of the upper electrode substrate 11 and the potential V3 (e.g., GND potential) of the lower electrode substrate 13, the largest focusing (converging) action is exerted on the center beam, and thus, the outer the beam concerned is, the smaller the focusing action becomes. Thereby, the image plane conjugate position of the center beam after passing through the aberration corrector 204 can be controlled to be an image plane conjugate position Z1 which is close to the aberration corrector 204. Moreover, the image plane conjugate position of a peripheral side beam after passing through the aberration corrector 204 can be controlled to be an image plane conjugate position Z3 which is farthest from the aberration corrector 204. Then, the image plane conjugate position of the middle beam located in the middle of the center beam and the peripheral beam after passing through the aberration corrector 204 can be controlled to be an image plane conjugate position Z2 which is at the middle distance from the aberration corrector 204.

The electric potentials V1 and V3 may be the same as each other or different from each other. It is sufficient that the electric potential V2 is, for example, a negative potential based on the electric potential V1, and a desired electric potential difference exists between V1 and V2. Similarly, it is sufficient that the electric potential V2 is, for example, a negative potential based on the electric potential V3, and a desired electric potential difference exists between V3 and V2.

According to the first embodiment, in each of the stacked electrode substrates 11, 12, and 13, the diameter (or radius) of each of a plurality of passage holes 15 is rotation symmetrical to the trajectory central axis of the whole multiple primary electron beams 20. In the example of FIG. 3, regarding the position of the center beam of the 5×5 multiple primary electron beams 20 as a trajectory central axis of the whole multiple primary electron beams 20, concentric circles (dotted lines) are formed. The passage holes 15 which have their centers on the same one of the concentric circles are formed to be circles having the same diameter dimension. Then, in each of the stacked electrode substrates 11, 12, and 13, the diameter dimension of each of a plurality of passage holes 15 is made to be larger with distance from the trajectory central axis of the whole of the multiple primary electron beams 20. With this configuration, the trajectory can be corrected such that the more the beam concerned is far from the center beam toward the outer side, the more the image plane conjugate position after passage through the aberration corrector 204 is far from the aberration corrector 204. Thereby, if the focus position of a peripheral side beam of the multiple primary electron beams 20 is adjusted to be on the surface of the substrate 101, the focus position of the center beam can be shifted upward to be on the surface of the substrate 101.

It is sufficient, in advance, to measure deviation of the focus position of each beam and to obtain the diameter dimension of the passage hole 15 which is used for correcting the deviation.

Now, a comparative example to the first embodiment is described, where in the case of changing the position conjugate to an image plane of an electron beam (e) emitted at the acceleration voltage of, for example, −10 kV and moving at high speed, by the aberration corrector 204, at outside the magnetic field of the electromagnetic lens 205, it is necessary to apply an electric potential having around the same level as an acceleration voltage, for example, a potential around −10 kV, to the middle electrode substrate 12. A ground potential GND is applied to the upper and lower electrode substrates 11 and 13. On the other hand, according to the first embodiment, the aberration corrector 204 is disposed in the magnetic field of the electromagnetic lens 205. Thereby, if the electron beam (e) emitted at the acceleration voltage of, for example, −10 kV and moving at high speed enters the magnetic field of the electromagnetic lens 205, the moving speed of the electron becomes slow due to the magnetic field. Therefore, in the case of changing the image plane conjugate position being the focus position of the intermediate image focused by the electromagnetic lens 205, since the trajectory of an electron beam is corrected by the aberration corrector 204 in the state where the moving speed of the electron is slow, in other words, where the energy of the electron is small, it is possible to reduce the potential to be applied to the middle electrode substrate 12 to, for example, about −100 V, being $\frac{1}{100}$ of the acceleration voltage of, for example, −10 kV when applying the ground potential GND to the upper and lower electrode substrates 11 and 13.

Figure 6:
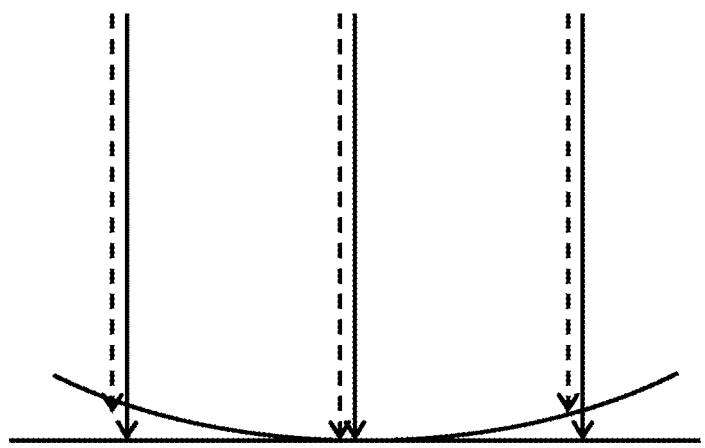
FIG. 6 illustrates an effect of an aberration corrector according to the first embodiment.

FIG. 6 illustrates an effect of an aberration corrector according to the first embodiment. With respect to the multiple primary electron beams 20 with field curvature shown by dashed lines, by individually correcting, by the aberration corrector 204, the image plane conjugate position after passage through the aberration corrector 204, as illustrated in FIG. 6, the focus position of each beam can be focused on the same plane such as the surface of the substrate 101 as shown by solid lines.

Figure 7:
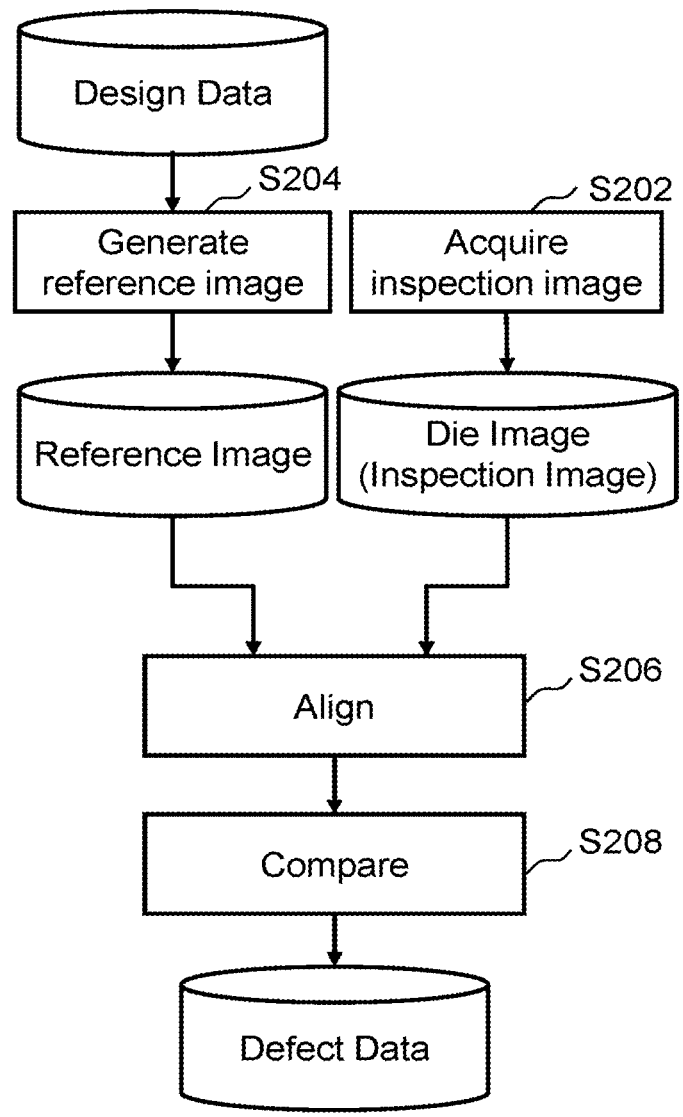
FIG. 7 is a flowchart showing main steps of an inspection method according to the first embodiment.

FIG. 7 is a flowchart showing main steps of an inspection method according to the first embodiment. In FIG. 7, the inspection method of the first embodiment executes a series of steps: an inspection image acquisition step (S202), a reference image generation step (S204), an alignment step (S206), and a comparison step (S208).

In the inspection image acquisition step (S202), the image acquisition mechanism 150 acquires a secondary electron image of a pattern formed on the substrate 101 (target object), by using the multiple primary electron beams 20 having passed through the aberration corrector 204. Specifically, it operates as follows: As described above, the multiple primary electron beams 20 formed by the shaping aperture array substrate 203 enter the electromagnetic lens 205.

While passing through the magnetic field of the electromagnetic lens 205, the beam trajectory of each of the multiple primary electron beams 20 is individually corrected by the aberration corrector 204. Then, the multiple primary electron beams 20 pass through the common blanking deflector 212, the limiting aperture substrate 206, the electromagnetic lens 220, and the beam separator 214. Then, after passing through the stacked electrode substrates 11, 12, and 13, the multiple primary electron beams 20 are focused on the surface of the substrate 101 by the objective lens 207. The substrate 101 to be irradiated with the multiple primary electron beams 20 having passed through the stacked electrode substrates 11, 12, and 13 is placed on the XY stage 105. The multiple secondary electron beams 300 emitted from the substrate 101 pass through the objective lens 207, the beam separator 214, the deflector 218, and the projection lens 224 so that each secondary electron beam may be individually detected by the multi-detector 222.

Figure 8:
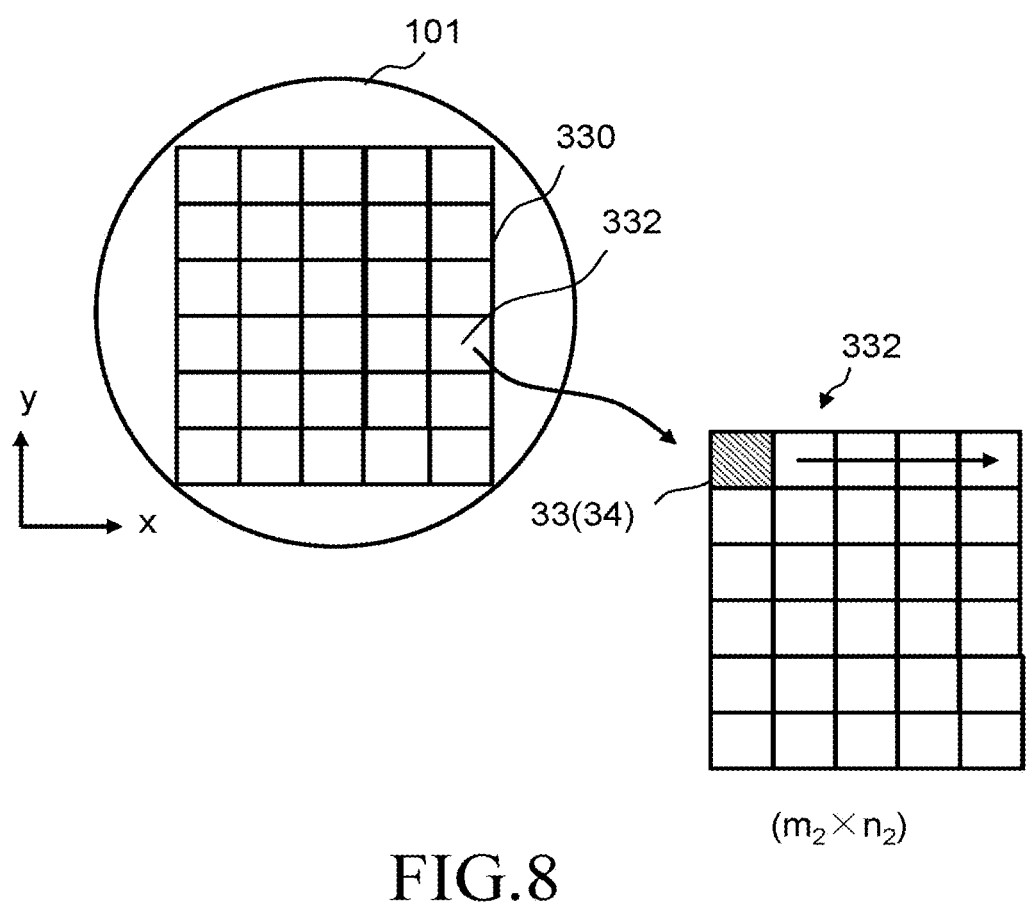
FIG. 8 shows an example of a plurality of chip regions formed on a semiconductor substrate, according to the first embodiment.

FIG. 8 shows an example of a plurality of chip regions formed on a semiconductor substrate, according to the first embodiment. In FIG. 8, when the substrate 101 is a semiconductor substrate (wafer), a plurality of chips (wafer dies) 332 in a two-dimensional array are formed in an inspection region 330 of the semiconductor substrate (wafer die). A mask pattern for one chip formed on an exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or more), for example. In the first embodiment, a mask die 33 serves as a unit inspection region.

Figure 9:
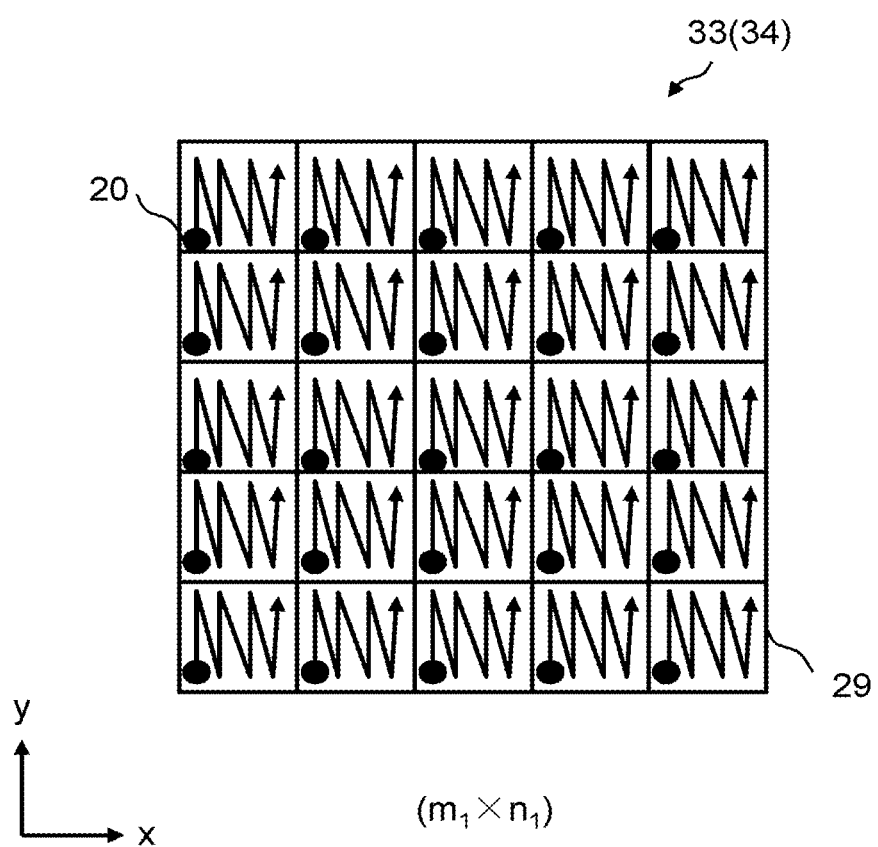
FIG. 9 illustrates a scanning operation with multiple beams according to the first embodiment.

FIG. 9 illustrates a scanning operation with multiple beams according to the first embodiment. FIG. 9 shows the case of multiple primary electron beams 20 of 5×5 (rows by columns). The size of an irradiation region 34 that can be irradiated by one irradiation with the multiple primary electron beams 20 is defined by (x direction size obtained by multiplying a pitch between beams in the x direction of the multiple primary electron beams 20 on the substrate 101 by the number of beams in the x direction)×(y direction size obtained by multiplying a pitch between beams in the y direction of the multiple primary electron beams 20 on the substrate 101 by the number of beams in the y direction). In the case of FIG. 9, the irradiation region 34 and the mask die 33 are of the same size. However, it is not limited thereto. The irradiation region 34 may be smaller than the mask die 33, or larger than it. Each beam of the multiple primary electron beams 20 scans the inside of a sub-irradiation region 29 surrounded by the pitch between beams in the x direction and the pitch between beams in the y direction, where the beam concerned itself is located. Each beam of the multiple primary electron beams 20 is associated with any one of the sub-irradiation regions 29 which are different from each other. At the time of each shot, each beam irradiates the same position in the associated sub-irradiation region 29. The beam is moved in the sub-irradiation region 29 by collective deflection of all the multiple primary electron beams 20 by the sub deflector 209. By repeating this operation, one beam irradiates all the pixels in order in one sub-irradiation region 29.

As described above, the whole of the multiple primary electron beams 20 scans the mask die 33 as the irradiation region 34, and that is, each beam individually scans one corresponding sub-irradiation region 29. After scanning one mask die 33, the irradiation region 34 is moved to a next adjacent mask die 33 so as to be scanned. This operation is repeated to proceed scanning of each chip 332. Due to shots of the multiple primary electron beams 20, secondary electrons are emitted from the irradiated positions at each shot time, and detected by the multi-detector 222.

By performing scanning with the multiple primary electron beams 20 as described above, the scanning operation (measurement) can be performed at a higher speed than scanning with a single beam. The scanning of each mask die 33 may be performed by the "step and repeat" operation, or performed by continuously moving the XY stage 105. When the irradiation region 34 is smaller than the mask die 33, the scanning operation can be performed while moving the irradiation region 34 in the mask die 33 concerned.

When the substrate 101 is an exposure mask substrate, the region of one chip formed on the exposure mask substrate is divided into a plurality of stripe regions in a strip form by the size of the mask die 33 described above, for example. Then, each mask die 33 can be scanned by the same scanning operation described above for each stripe region. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the scanning distance for scanning the chip region of one chip is, for example, four times the distance for scanning the chip region of one chip of the mask die 33 of the semiconductor substrate. However, since a pattern for one chip is formed on the exposure mask substrate, the scanning distance can be less compared to the case of the semiconductor substrate on which more than four chips are formed.

In the meantime, detected data (measured image: secondary electron image: image to be inspected) on a secondary electron from each position detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, together with information data on each position from the position circuit 107.

In the reference image generation step (S204), the reference image generation circuit 112 (reference image generation unit) generates a reference image corresponding to an inspection image to be inspected. The reference image generation circuit 112 generates the reference image for each frame region, based on design data serving as a basis for forming a pattern on the substrate 101, or on design pattern data defined by exposure image data of a pattern formed on the substrate 101. Preferably, for example, the mask die 33 is used as the frame region. Specifically, it operates as follows: First, design pattern data is read from the storage device 109 through the control computer 110, and each figure pattern defined in the read design pattern data is converted into image data of binary or multiple values.

Here, basics of figures defined by the design pattern data are, for example, rectangles and triangles. For example, there is stored figure data defining the shape, size, position, and the like of each pattern figure by using information, such as coordinates (x,y) of the reference position of the figure, lengths of sides of the figure, and a figure code serving as an identifier for identifying the figure type such as rectangles, triangles and the like.

When design pattern data serving as the figure data is input to the reference image generation circuit 112, the data is developed into data of each figure. Then, the figure code indicating the figure shape, the figure dimensions, and the like of each figure data are interpreted. Then, the reference image generation circuit 112 develops each figure data to design pattern image data of binary or multiple values as a pattern to be arranged in a square in units of grids of predetermined quantization dimensions, and outputs the developed data. In other words, the reference image generation circuit 112 reads design data, calculates an occupancy rate occupied by a figure in the design pattern, for each square region obtained by virtually dividing the inspection region into squares in units of predetermined dimensions, and outputs n-bit occupancy rate data. For example, it is preferable to set one square as one pixel. Assuming that one pixel has a resolution of $1/2^8$ (=1/256), the occupancy rate in each pixel is calculated by allocating small regions which correspond to the region of figures arranged in the pixel concerned and each of which corresponds to 1/256 resolution. Then, 8-bit occupancy rate data is output to the reference image generation circuit 112. The square region (inspection pixel) may be in accordance with the pixel of measured data.

Next, the reference image generation circuit 112 performs appropriate filter processing on design image data of a design pattern which is image data of a figure. Since optical image data as a measured image is in the state affected by the filtering performed by the optical system, in other words, in an analog state continuously changing, it is possible to match/fit the design image data with the measured data by also applying a filtering process to the design image data being image data on the design side whose image intensity (gray scale level) is represented by digital values. The generated image data of a reference image is output to the comparison circuit 108.

Figure 10:
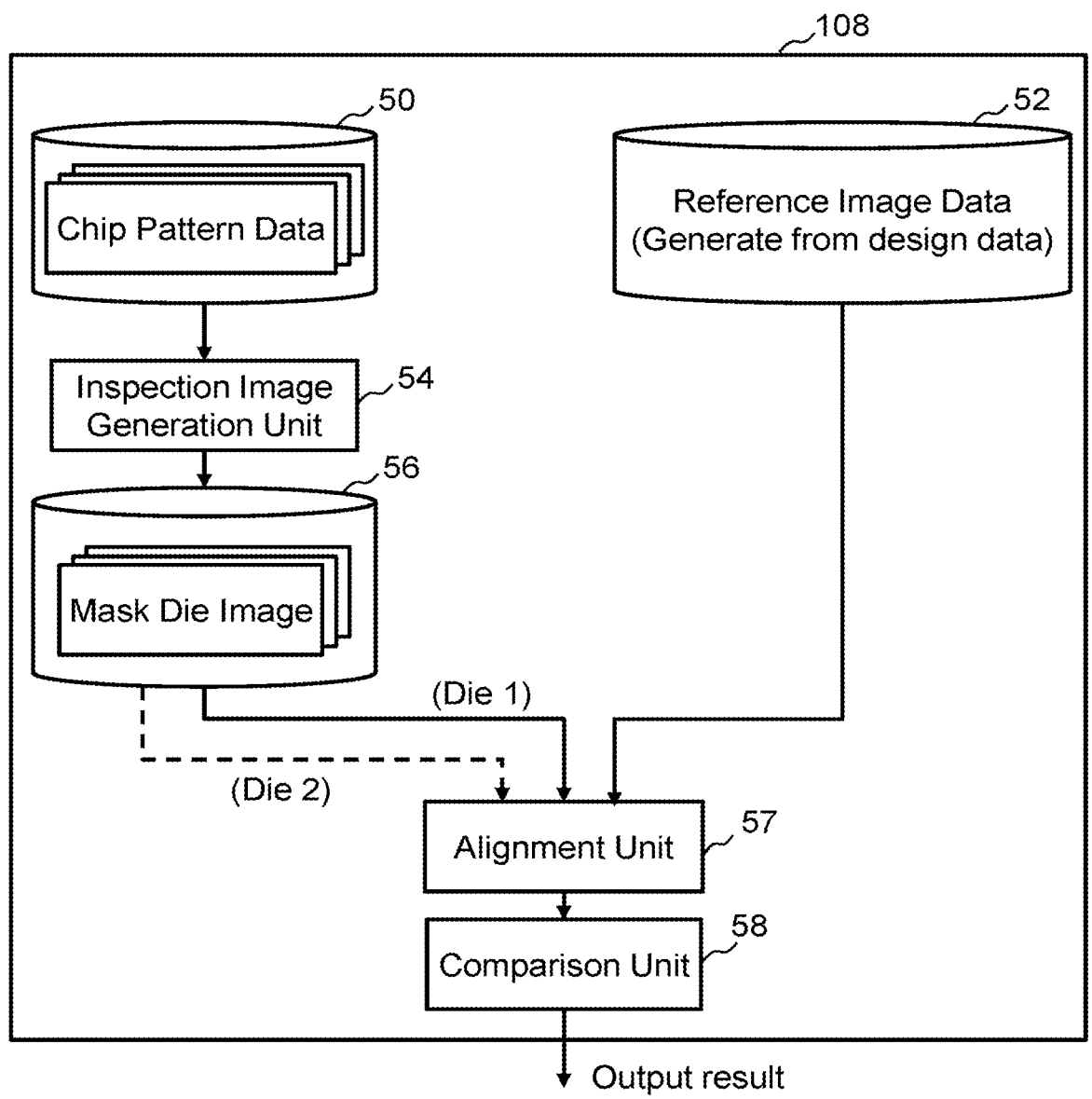
FIG. 10 shows an example of an internal configuration of a comparison circuit according to the first embodiment.

FIG. 10 shows an example of an internal configuration of a comparison circuit according to the first embodiment. In FIG. 10, storage devices 50, 52 and 56, such as magnetic disk drives, an inspection image generation unit 54, an alignment unit 57, and a comparison unit 58 are arranged in the comparison circuit 108. Each of the "units" such as the inspection image generation unit 54, the alignment unit 57, and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the inspection image generation unit 54, the alignment unit 57, and the comparison unit 58, and calculated results are stored in a memory (not shown) or in the memory 118 each time.

In the comparison circuit 108, transmitted stripe pattern data (or chip pattern data) is temporarily stored in the storage device 50, together with information indicating each position from the position circuit 107. Moreover, transmitted reference image data is temporarily stored in the storage device 52.

Next, using the stripe pattern data (or chip pattern data), the inspection image generation unit 54 generates a frame image (inspection image, that is, image to be inspected) for each frame region (unit inspection region) having a predetermined size. As the frame image, here, an image of the mask die 33 is generated, for example. However, the size of the frame region is not limited thereto. The generated frame image (e.g., mask die image) is stored in the storage device 56.

In the alignment step (S206), the alignment unit 57 reads a mask die image serving as an inspection image, and a reference image corresponding to the mask die image, and provides alignment/positioning between the images based on units of sub-pixels smaller than pixels 36. For example, the alignment can be performed by a least-square method.

In the comparison step (S208), the comparison unit 58 compares the mask die image (inspection image) and the reference image concerned. The comparison unit 58 compares them, for each pixel 36, based on predetermined determination conditions in order to determine whether there is a defect such as a shape defect. For example, if a gray scale level difference of each pixel 36 is larger than a determination threshold Th, it is determined that there is a defect. Then, the comparison result may be output specifically to the storage device 109, the monitor 117, or the memory 118, or alternatively, output from the printer 119.

Although the die-to-database inspection is described above, the die-to-die inspection may also be performed. In the case of conducting the die-to-die inspection, images of the mask dies 33 with the same patterns formed thereon are compared.

Accordingly, an image of the mask die 33 of a partial region of the chip 332 serving as a die (1), and an image of the mask die 33 of a corresponding region of another chip 332 serving as a die (2) are used. Alternatively, an image of the mask die 33 of a partial region of the chip 332 serving as a die (1), and an image of the mask die 33 of another partial region of the same chip 332 serving as a die (2), where the same patterns are formed, may be compared. In such a case, if one of the images of the mask dies 33 on which the same patterns are formed is used as a reference image, inspection can be performed by the same method as that of the die-to-database inspection described above.

That is, in the alignment step (S206), the alignment unit 57 reads the image of the mask die 33 of the die (1) and the image of the mask die 33 of the die (2), and provides alignment between the images, based on units of sub-pixels smaller than units of pixels. For example, the alignment can be performed using a least-square method.

Then, in the comparison step (S208), the comparison unit 58 compares the image of the mask die 33 of the die (1) and the image of the mask die 33 of the die (2). The comparison unit 58 compares them, for each pixel 36, based on predetermined determination conditions in order to determine whether there is a defect such as a shape defect. For example, if a gray scale level difference of each pixel 36 is larger than the determination threshold Th, it is determined that there is a defect. Then, the comparison result may be output specifically to the storage device 109, the monitor 117, or the memory 118, or alternatively, output from the printer 119.

Figure 11:
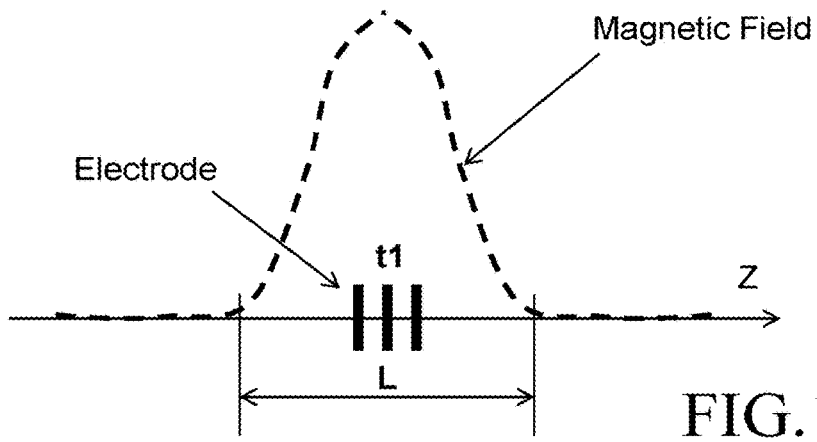
FIG. 11 shows an example of an electrode in the case of regarding an aberration corrector as an electrostatic lens according to the first embodiment.
Figure 12:
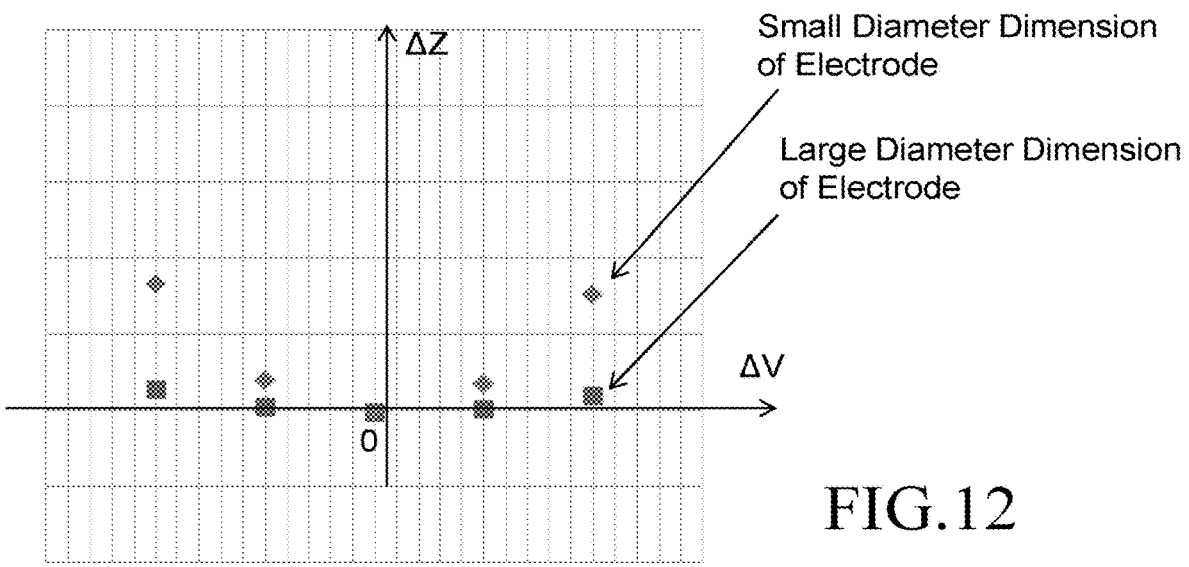
FIG. 12 shows an example of a focusing action corresponding to FIG. 11.

FIG. 11 shows an example of an electrode in the case of regarding an aberration corrector as an electrostatic lens according to the first embodiment. FIG. 12 shows an example of a converging (focusing) action corresponding to FIG. 11. In FIG. 12, the ordinate axis represents strength of a converging action, and the abscissa axis represents an applied potential. In the example of FIG. 11, the thickness t1 of the electrostatic lens (middle electrode substrate) is very small against the spread range L of the magnetic field distribution. In that case, receiving no magnetic field influence, the effect of the converging action shown by the parabola of FIG. 12 is obtained as an effect of the electrostatic lens. Whether the applied potential is positive or negative, it turns out that the converging action is larger when the diameter dimension of the passage hole 15 is small than when it is large.

Therefore, as described above, it is sufficient that the focus position of a peripheral side beam of the multiple primary electron beams 20 is set to be adjusted (focused) on the surface of the substrate 101 when the field curvature is convex downward, and that the diameter dimension of each of a plurality of passage holes 15 becomes larger as being farther from the trajectory central axis of the whole multiple primary electron beams 20. Thereby, the trajectory can be corrected to correct the field curvature so that the image plane conjugate position after passage through the aberration corrector 204 may be closer to the aberration corrector 204 since the closer to the center the beam concerned is, the larger the converging action is exerted.

On the other hand, when the field curvature is convex upward, it is necessary to correct the trajectory such that the closer to the center the beam concerned is, the more the image plane conjugate position after passage through the aberration corrector 204 is far from the aberration corrector 204. In that case, it is sufficient that the focus position of the center beam of the multiple primary electron beams 20 is set to be adjusted (focused) on the surface of the substrate 101, and that the diameter dimension of each of a plurality of passage holes 15 becomes smaller as being farther from the trajectory central axis of the whole multiple primary electron beams 20. Thereby, the trajectory can be corrected to correct the field curvature so that the image plane conjugate position after passage through the aberration corrector 204 may be closer to the aberration corrector 204 since the more outward from the center the beam concerned is, the larger the converging action is exerted.

Figure 13:
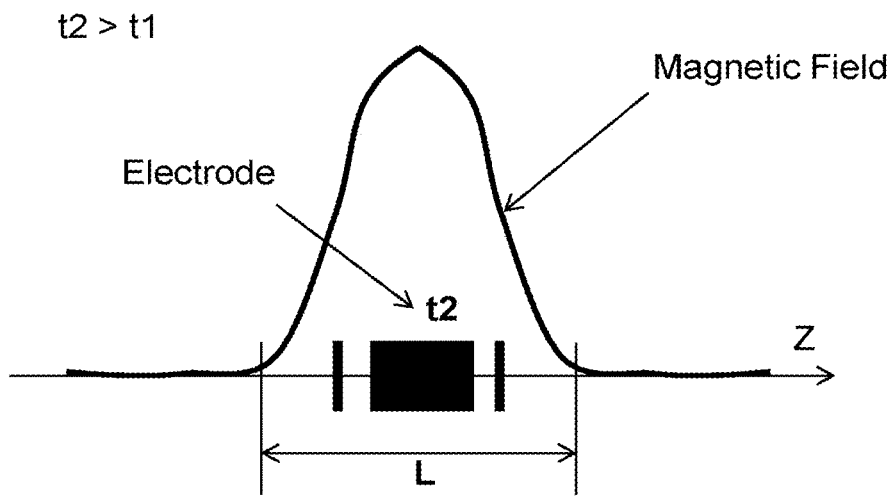
FIG. 13 shows another example of an electrode in the case of regarding an aberration corrector as an electrostatic lens according to the first embodiment.
Figure 14:
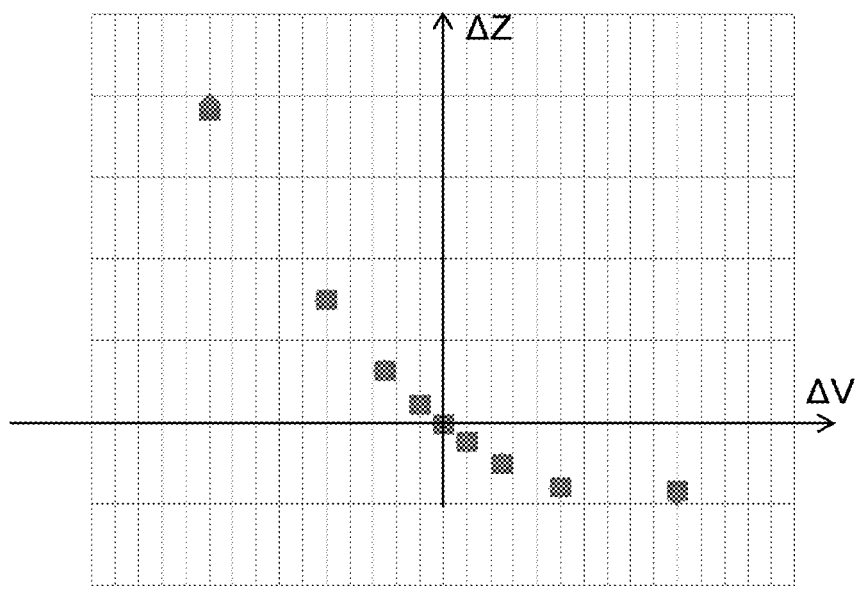
FIG. 14 shows an example of a converging (focusing) action corresponding to FIG. 13.

FIG. 13 shows another example of an electrode in the case of regarding an aberration corrector as an electrostatic lens according to the first embodiment. FIG. 14 shows an example of a converging (focusing) action corresponding to FIG. 13. In FIG. 14, the ordinate axis represents strength of the focusing action, and the abscissa axis represents an applied potential. If the thickness t2 of the middle electrode of the electrostatic lens becomes larger by a certain amount or more than the spread range L of the magnetic field distribution, there further occurs a converging (focusing) action effect corresponding to an energy change in the magnetic field as shown in FIG. 14 in addition to the converging action shown in FIG. 12. Therefore, in that case, the converging action greatly changes depending on a sign (positive or negative) of the potential to be applied. Since the larger or smaller relation between the effects of FIGS. 12 and 14 differs depending on combination of the electrostatic lens and the magnetic lens, the relation between the aperture diameter of the passage hole 15 of each electrode and the potential is not uniquely determined.

Therefore, when the thickness of the middle electrode of the aberration corrector 204 is very small against the influence range L of the magnetic field, the applied potential can be set whether a magnetic lens exists or not. On the other hand, when increasing the thickness of the middle electrode of the aberration corrector 204, as long as the aberration corrector 204 is not disposed in the influence range of the magnetic field, the aperture diameter of the passage hole 15 of each electrode and the applied potential can be set in accordance with the effect of FIG. 12. However, when the aberration corrector 204 is disposed in the influence range of the magnetic field, since the effect of FIG. 14 further occurs, relation between the aperture diameter of the passage hole 15 of each electrode and the applied potential is obtained in advance by experiment and the like to appropriately set them based on this relation.

As described above, according to the first embodiment, the field curvature of the multiple primary electron beams 20 can be corrected by selecting the diameter dimension of the passage hole 15. Therefore, difference (variation) of the spot diameter of the beam under the influence of a field curvature aberration can be suppressed. Accordingly, a field of view (FOV) can be increased in a review or inspection, such as observation of the surface of the substrate 101. Furthermore, since just one sort of potential is applied to one electrode substrate, the number of power supplies can be suppressed. Therefore, it can be avoided that the apparatus has a large-scale structure.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the aberration correction circuit 121, the deflection control circuit 128, etc. may be configured by at least one processing circuit described above.

Embodiments have been explained referring to specific examples described above. However, the present invention is not limited to these specific examples.

While the apparatus configuration, control method, and the like not directly necessary for explaining the present invention are not described, some or all of them can be appropriately selected and used on a case-by-case basis when needed.

In addition, any other multiple electron beam irradiation apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam irradiation apparatus comprising:
   a forming mechanism which forms multiple primary electron beams;
   an electromagnetic lens which refracts the multiple primary electron beams;
   a plurality of electrode substrates being stacked in each of which a plurality of openings of various diameter dimensions are formed, the plurality of openings being arranged at passage positions of the multiple primary electron beams, and through each of which a corresponding one of the multiple primary electron beams passes, the plurality of electrode substrates being able to adjust an image plane conjugate position of the each of the multiple primary electron beams depending on a corresponding one of the various diameter dimensions, the plurality of electrode substrates disposed in a magnetic field of the electromagnetic lens; and
   a stage which is capable of mounting thereon a target object to be irradiated with the multiple primary electron beams having passed through the plurality of electrode substrates.

2. The apparatus according to claim 1 further comprising:
   a power supply circuit which applies an independent potential to each of the plurality of electrode substrates.

3. The apparatus according to claim 1, wherein, in each of the plurality of electrode substrates, a diameter dimension of each of the plurality of openings is rotation symmetrical to a trajectory central axis of a whole of the multiple primary electron beams.

4. The apparatus according to claim 1, wherein, in each of the plurality of electrode substrates, a diameter dimension of each of the plurality of openings becomes larger with distance from a trajectory central axis of a whole of the multiple primary electron beams.

5. The apparatus according to claim 1, wherein each of the plurality of electrode substrates is disposed at a position different from a position conjugate to an image plane of the each of the multiple primary electron beams.

6. The apparatus according to claim 1 further comprising:
   an objective lens which focuses the multiple primary electron beams having passed through the plurality of electrode substrates onto a surface of the target object.

7. The apparatus according to claim 1 further comprising:
   a beam separator which separates multiple secondary electron beams, emitted by that the target object is irradiated with the multiple primary electron beams, from the multiple primary electron beams; and
   a multi-detector that individually detects the multiple secondary electron beams having been separated.

8. A multiple electron beam irradiation method comprising:
   forming multiple primary electron beams;
   making the multiple primary electron beams pass through a plurality of electrode substrates being stacked in each of which a plurality of openings of various diameter dimensions are formed, the plurality of openings being arranged at passage positions of the multiple primary electron beams, and through each of which a corresponding one of the multiple primary electron beams passes, the plurality of electrode substrates being able to adjust an image plane conjugate position of the each of the multiple primary electron beams depending on a corresponding one of the various diameter dimensions, the plurality of electrode substrates disposed in a magnetic field of the electromagnetic lens which refracts the multiple primary electron beams; and
   irradiating a target object placed on a stage with the multiple primary electron beams having passed through the plurality of electrode substrates.

9. The method according to claim 8 further comprising:
   applying an independent potential to each of the plurality of electrode substrates.

10. The method according to claim 8, wherein, in each of the plurality of electrode substrates, a diameter dimension of each of the plurality of openings is rotation symmetrical to a trajectory central axis of a whole of the multiple primary electron beams.

* * * * *